United States Patent
Seymour et al.

(10) Patent No.: US 6,972,079 B2
(45) Date of Patent: Dec. 6, 2005

(54) DUAL MAGNETRON SPUTTERING APPARATUS UTILIZING CONTROL MEANS FOR DELIVERING BALANCED POWER

(75) Inventors: Eric A. Seymour, Fort Collins, CO (US); Annabelle Pratt, Fort Collins, CO (US)

(73) Assignee: Advanced Energy Industries Inc., Fort Collins, CO (US)

( * ) Notice: Subject to any disclaimer, the term of this patent is extended or adjusted under 35 U.S.C. 154(b) by 135 days.

(21) Appl. No.: 10/606,290

(22) Filed: Jun. 25, 2003

(65) Prior Publication Data

US 2004/0262156 A1    Dec. 30, 2004

(51) Int. Cl.[7] .............................................. C23C 14/35
(52) U.S. Cl. ........................ 204/298.08; 204/298.06; 204/298.14; 204/298.16
(58) Field of Search ................ 204/298.06, 298.08, 204/298.14, 298.16

(56) References Cited

U.S. PATENT DOCUMENTS 5,814,195 A * 9/1998 Lehan et al. ............ 204/192.12
6,563,076 B1 * 5/2003 Benjamin et al. ....... 219/121.54

* cited by examiner

*Primary Examiner*—Steven Versteeg
(74) *Attorney, Agent, or Firm*—Benjamin Hudson, Jr.; John D. Pirnot

(57) ABSTRACT

There is disclosed a dual magnetron sputtering apparatus that is comprised of a balancing circuit connected to the output of an ac power source that supplies ac power to at least two target materials such that the balancing circuit allows the power supply to deliver equal power to each target material. In those applications where there may be an erosion of one target material faster than the other, the balancing circuit allows the power supply to deliberately unbalance the power to at least one of the target materials to reduce power to the target to compensate for faster erosion of the target.

8 Claims, 3 Drawing Sheets

DUAL MAGNETRON SPUTTERING APPARATUS UTILIZING CONTROL MEANS FOR DELIVERING BALANCED POWER

BACKGROUND OF THE INVENTION

1. Field of the Invention

This invention relates generally to ac high power supplies designed specifically for use in a plasma environment. These power supplies provide wide-range, mid frequency sinusoidal process power for dual-magnetron sputtering. More particularly this invention relates to a dual magnetron power supply that utilizes a control means for delivering controlled balanced power to dual targets to achieve even deposition rates to both targets or uneven deposition rates if so desired.

2. Brief Description of the Prior Art

AC dual magnetron power supplies are ideally suited for large-area glass coating applications such as architectural, automotive, anti-reflective, and mirrors. In these applications there have been operational process difficulties attributed to asymmetrical cathode behavior. Symptoms include coat-over of one target in a pair or radically different erosion rates in a target pair. These problems can occur with all alternating current sine generators and can be due to an unbalance in delivered power between the targets. Possible causes of this unbalance can be due to uneven gas flows, different or uneven magnetic fields, targets with different oxidation states, or targets of different thicknesses. Some of these causes are inherent, and some may be eliminated or alleviated by forcing a balance or deliberate power unbalance. For example, if the unbalance is due to different oxidation states of the two targets, one may apply more power to the target with the higher coverage of oxide, causing the oxide coating to be sputtered away on that target, rebalancing the targets.

In transformer-coupled parallel-resonant power supplies that do not have a secondary side dc blocking capacitor (series capacitor), the presence of cathode asymmetry results in direct current flow in the transformer secondary and thus the load. This direct current flow subtracts from the current into one target and adds to the current in the other, resulting in an asymmetry in current levels in the two targets. Since the transformer secondary can have no average voltage across it, the volt-second area to each target must be the same. Taken with the current asymmetry, this implies a difference in power to the two targets. Alternatively, other power supplies may utilize a dc blocking capacitor in series with the output, such as the Crystal® brand power supply manufactured by Advanced Energy Industries, Inc., the assignee of the instant application. This capacitor prevents the flow of direct current into the load and so ensures that the charge delivered to the two targets is the same in each cycle. However, even with this charge balance, unbalanced power delivery may occur, since a net charge may accumulate on the capacitor, resulting in a difference in voltage between the two targets. To date, although this problem has generally been recognized in the industry, no one has proposed an adequate solution.

It would be desirable if there were provided a dual magnetron power supply that could provide balanced power to the load so that the deposition process on both targets is equal.

It would also be desirable if a power supply was available that could draw an appropriate amount of bias current to pull the cathodes into power consumption balance without overshooting to the opposite asymmetrical state.

It would also be desirable for a power supply to provide a means of deliberately altering the power imbalance power to the two targets as a possible corrective measure. This could result over time in a return to symmetrically inherent operation.

SUMMARY OF THE INVENTION

There is provided by this invention a dual magnetron power supply for use in plasma sputtering applications that utilizes a circuit at its output to maintain balance of the power consumption at the cathodes of the plasma sputtering apparatus. This circuit can be used for both the AC power supplies with or without that a dc blocking capacitor. For power supplies that do not tolerate direct current at its output terminals the balancing circuit is comprised of a series connected inductor and a variable resistor that shunts the dc current and prevents a portion of the possible dc voltage from being applied to the dc blocking capacitor. For those ac generators that do tolerate a direct current at its output terminals a parallel RCL circuit is placed in series with the output of the transformer.

BRIEF DESCRIPTION OF THE PREFERRED EMBODIMENTS

Figure 1:
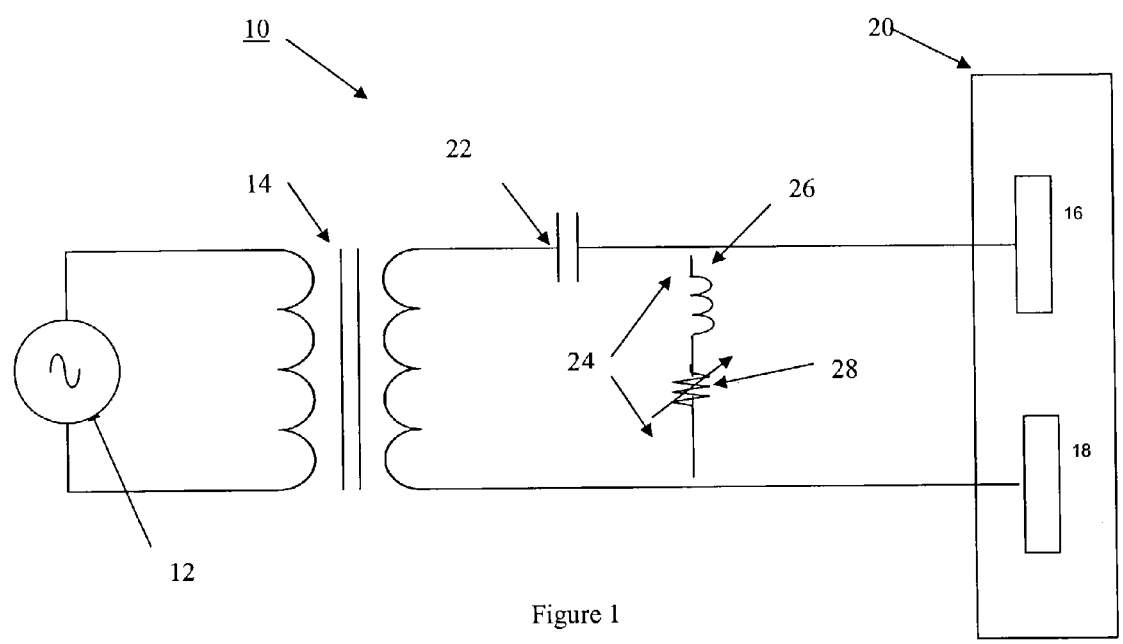
FIG. 1 illustrates a dual magnetron power supply driving a reactive sputtering process incorporating the principles of this invention.

There is shown in FIG. 1 a reactive dual magnetron sputtering system 10 that incorporates the principles of this invention. The power source is generally comprised of an ac generator 12 connected to the primary of a transformer 14 with its secondary output connected to dual targets 16 and 18 mounted in a plasma chamber 20. A blocking capacitor 22 is placed in series with the target loads 16 and 18 to prevent the flow of dc current to the target loads. A balancing circuit 24 is placed in parallel with the blocking capacitor 22 across the secondary of the transformer. The balancing circuit 24 is comprised of an inductor 26 and a variable resistor 28 that shunts the direct current and prevents some dc voltage from being applied to the dc blocking capacitor 22.

Figure 2:
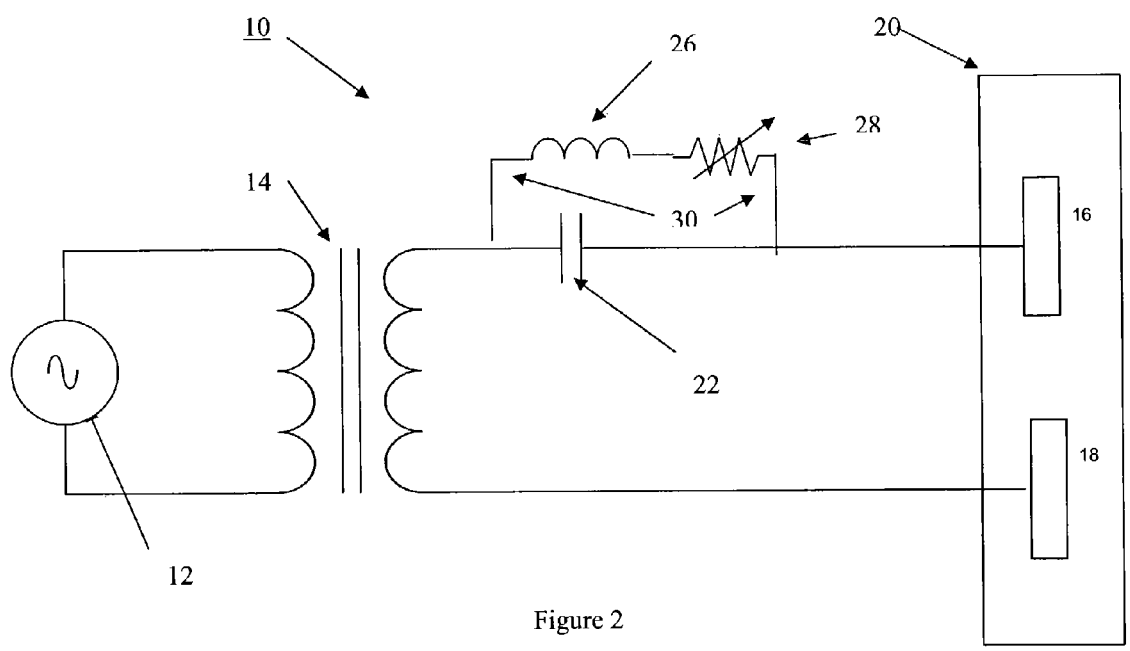
FIG. 2 illustrates the complement of the output of a dual magnetron power supply shown in FIG. 1 wherein the power supply tolerates direct current into its secondary.

FIG. 2 illustrates reactive dual magnetron sputtering systems such as 10 that utilize an ac generator of the parallel-resonant type that do not include a blocking capacitor such as 22 and behaves as an ac voltage source. In this instance a parallel RCL circuit 30 is placed in series with the output of the transformer. This circuit is the complement or dual of that shown in FIG. 1.

Figure 3:
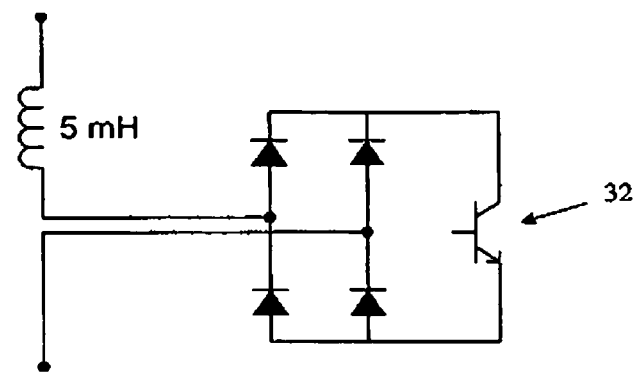
FIG. 3 is an implementation of the variable resistor shown in FIGS. 1 and 2 as a transistor operated linearly.
Figure 4:
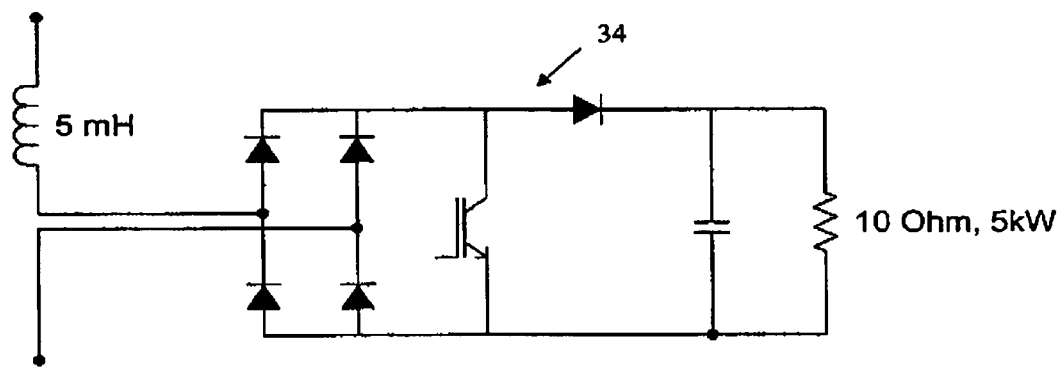
FIG. 4 is an implementation of the variable resistor shown in FIGS. 1 and 2 as a boost converter.

For both circuits the variable resistor may be implemented in at least two ways. FIG. 3 illustrates the variable resister 28 being implemented by a transistor 32 operated linearly. In FIG. 4 a boost converter circuit 34 is utilized to produce a variable resistive output. In both embodiments shown in FIGS. 1 and 2 the balancing circuits 24 and 30 dissipate, or regenerate power in order to balance the delivery of power to the targets.

It can readily be seen that there is provided herein a novel and unique dual magnetron sputtering system that utilizes a power supply with balancing circuits that may provide balanced power to the load so that the deposition process on both targets is equal, or may deliberately unbalance the power to the load in any desired way, perhaps to force a redistribution of power so that eventually the targets are balanced.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. A dual magnetron power sputtering apparatus comprising:
   a) a coating chamber containing at least two target materials;
   b) an ac power supply connected to a transformer to supply an ac voltage to the target materials wherein each of the target materials acts as a cathode and alternately as an anode on each half cycle of the ac voltage;
   c) a blocking capacitor in series with the output of the transformer and the target materials to prevent the flow of dc current to the target materials;
   d) a work piece disposed in close proximity of the target materials wherein the presence of a reactive gas sputtered materials from the targets combine with the gas to deposit a thin film on the work piece; and
   e) a balancing circuit connected across the output of the transformer wherein the balancing circuit allows the power supply to deliver equal power to each target material.

2. A dual magnetron power sputtering apparatus as recited in claim 1 wherein balancing circuit is comprised of a series connected inductor and a variable resistor that shunts dc current and prevents dc voltage from being applied to the dc blocking capacitor.

3. A dual magnetron power sputtering apparatus as recited in claim 2 wherein the balancing circuit causes a deliberate unbalance of power to at least one of the target materials to reduce power to the target thereby compensating for faster erosion of the target.

4. A dual magnetron power sputtering apparatus as recited in claim 2 wherein the variable resistor is implemented as a transistor operated linearly.

5. A dual magnetron power sputtering apparatus as recited in claim 2 wherein the variable resistor is implemented as a boost converter to produce a variable resistive output.

6. A dual magnetron power sputtering apparatus comprising:
   a) a coating chamber containing at least two target materials;
   b) an ac power supply connected to a transformer to supply an ac voltage to the target materials wherein each of the target materials acts as a cathode and alternately as an anode on each half cycle of the ac voltage;
   c) a work piece disposed in close proximity of the target materials wherein the presence of a reactive gas sputtered materials from the targets combine with the gas to deposit a thin film on the work piece; and
   d) a balancing circuit connected in series with the output of the transformer and the target materials wherein the balancing circuit allows the power supply to deliver equal power to each target material.

7. A dual magnetron power sputtering apparatus as recited in claim 6 wherein balancing circuit is comprised of a parallel resister-capacitor-inductor (RCL) circuit placed in series with the output of the transformer.

8. A dual magnetron power sputtering apparatus as recited in claim 6 wherein the balancing circuit causes a deliberate unbalance of power to at least one of the target materials to reduce power to the target to compensate for faster erosion of the target.

* * * * *